United States Patent [19]
Fjare et al.

[11] Patent Number: 5,292,445
[45] Date of Patent: Mar. 8, 1994

[54] WET-ETCH PROCESS AND COMPOSITION

[75] Inventors: Douglas E. Fjare, Naperville; Allyson J. Beuhler, Indian Head Park; Cynthia A. Navar, Aurora, all of Ill.

[73] Assignee: Amoco Corporation, Chicago, Ill.

[21] Appl. No.: 915,102

[22] Filed: Jul. 16, 1992

Related U.S. Application Data

[60] Division of Ser. No. 605,555, Oct. 30, 1990, Pat. No. 5,183,534, and a continuation-in-part of Ser. No. 491,438, Mar. 9, 1990, abandoned.

[51] Int. Cl.$^5$ ............................................. C09K 13/00
[52] U.S. Cl. .................... 252/79.5; 252/79.1; 156/668
[58] Field of Search ................ 252/79.1, 79.4, 79.5; 134/38, 40; 156/668

[56] References Cited

U.S. PATENT DOCUMENTS

| | | | |
|---|---|---|---|
| 4,369,090 | 1/1983 | Wilson et al. | 156/668 X |
| 4,411,735 | 10/1983 | Belani | 156/668 X |
| 4,873,136 | 10/1989 | Foust et al. | 156/668 X |

*Primary Examiner*—Thi Dang
*Attorney, Agent, or Firm*—Rae K. Stuhlmacher; Mary Jo Kanady; Wallace L. Oliver

[57] ABSTRACT

A wet-etch composition for polyamic acids and partially cured polyamic acids comprising an aqueous solution having a major portion of water, a substituted hydrocarbon solvent and a non-ionic base that is strong enough to deprotonate the polyamic acid or a partially cured polyamic acid in a weight ratio of 0.1–49:49–0.1, with the proviso that the composition contains less than 1.0 percent ionic base. The present invention further provides a process for wet-etching polyamic acids or partially cured polyamic acids.

10 Claims, No Drawings

WET-ETCH PROCESS AND COMPOSITION

RELATED APPLICATION

This is a divisional of application Ser. No. 07/605,555, filed Oct. 30, 1990, now U.S. Pat. No. 5,183,534 and a continuation-in-part of copending U.S. patent application Ser. No. 491,438, filed Mar. 9, 1990, abandoned, fully incorporated herein by reference.

FIELD OF THE INVENTION

This invention relates to a wet-etch composition and a process therefor. More particularly, the present invention relates to a wet-etch composition for polyamic acid and for partially cured polyamic acid comprising an aqueous solution of a substituted hydrocarbon solvent and a non-ionic base which is strong enough to deprotonate the polyamic acid or the partially cured polyamic acid, and a process therefor.

BACKGROUND OF THE INVENTION

Aromatic polyimides have found extensive use in industry as fibers, composites, molded parts and dielectrics due to their toughness, flexibility, mechanical strength and high thermal stability. In the electronic industry, polyimides have proven to be useful due to their low dielectric constant and high electrical resistivity. Such polymers have been used in both film and coating form as advanced materials for such uses as interlevel dielectrics, passivation coatings, insulating coatings, optical waveguides, planarization layers, die attach adhesives, solder masks, flexible circuit substrates, fabrication aids, and the like.

Many electronic applications, for example, passivation coatings on a substrate, require that openings such as vias or patterns be etched through the polymer coatings to permit access for electrical connections that run between the substrate and the outside environment. There are two conventional methods for etching these polymer coatings: dry etching and wet etching. Dry etching generally involves the use of gaseous plasmas of oxygen or oxygen/carbon tetrafluoride mixtures which are exposed to a fully cured polyimide. The dry-etching process, however, is slow and requires sophisticated equipment.

Wet-etching processes differ depending on the state of cure (or imidization) of the polyimide. Fully or substantially fully cured polyimides can be etched using either hydrazine hydrate or ethylene diamine. The use of these compounds is not preferred for various reasons. Wet etching of partially cured polyamic acid films typically involves the use of basic solutions, for example, aqueous solutions of either tetramethylammonium hydroxide (TMAH) or sodium hydroxide (NaOH). However, aqueous solutions of TMAH or NaOH do not completely etch many of the recently developed polyimides.

Recently, polyimides have been developed that have improved dielectric constants and lower moisture uptake values. One approach to developing the improved polyimides has been to dilute the amic acid content of the polymer by using longer chain starting materials. However, since it is the amic acid moiety that forms a soluble salt with the hydroxide moiety of the aqueous hydroxide solution, diluting the amic acid moiety contributes to a decrease in solubility. Another approach has been to introduce non-polar (hydrophobic) substituents such as fluorine into the polyimide structure. Fluorinated polyimides offer up to 20 percent reduction in dielectric constant, indicating a less polar polymer and higher signal speeds as compared to conventional polar polyimides. In addition, fluorinated polyimides absorb less than one-third of the moisture that is absorbed by many conventional polyimides. Although the increased hydrophobic nature of these polyimides produces a polymer with the desirable properties, it also makes these polyimides more difficult to process by the usual wet chemical techniques due to their lower solubility in aqueous solutions.

Ruiz et al., Electronic Materials and Processes, International SAMPE Electronics Conf. Series, Vol. 3 (1989), examined the performance properties of fluorinated polyimides and concluded that patterning must be carried out using oxygen plasma (dry) etching techniques.

Additionally, during the wet-etch procedure, a pattern of positive photoresist material remains on the polyamic acid layer to cover and protect selected areas of polyamic acid and provide a means of etching (or removing) only the areas of the polyamic acid coating not covered by photoresist material. Accordingly, care must be taken such that the wet-etch composition does not attack the photoresist material, otherwise the entire layer of polyamic acid may be removed, and the desired vias through the polymer coating will not be created.

Davis et al., Recent Advances in Polyimide Science and Technology, Proc. 2nd Ellenville Conf. on Polyimides, 381–388 (1987), investigated a 3,3'-4,4'-benzophenonetetracarboxylic acid dianhydride, 4,4'-methylenedianiline, polytetramethyldisiloxane diamine-derived polymer system. The reference teaches that wet-etch compositions containing sodium hydroxide, potassium hydroxide, or tetramethylammonium hydroxide can lead to significant undercut of the photoresist material.

Attempts have been made to provide wet-etch solutions for polyimides and polyamic acids. U.S. Pat. No. 4,857,143 is directed to the wet-etching of fully cured or substantially fully cured polyimides. This references discloses an aqueous solution of a metal hydroxide such as an alkali metal or alkali earth hydroxide and requires the presence of a metallic compound selected from metal carbonates, sulfates and phosphates.

U.S. Pat. No. 4,411,735 discloses an etchant composition for etching a partially cured polyimide or polyimide-isoindoloquinazolinedione comprising a water solution containing an amine etchant or, alternatively, a water solution containing a mixture of a quaternary ammonium hydroxide and an N-alkyl pyrrolidone.

U.S. Pat. No. 4,740,562 discloses an etching solution for modifying a polymer surface. This reference attempts to affect the anti-adhesive behavior and low adhesion of the surface of objects made from polyvinylidene fluoride so that composite structures and laminates can be made from the polymer. Dehydrofluorination is carried out with an etching solution containing a strongly basic compound (hydroxides and/or alcoholates of alkali, alkaline earth, or earth metals), a swelling agent and/or solvent for polyvinylidene fluoride, and an auxiliary agent for the homogenization of the etching solution. The auxiliary agent, which also acts as a solubilizer for the basic compound, includes methanol, ethanol, isopropanol, cyclohexanol, ethylene glycol and/or glycerin.

Diener et al., Polyimides, Vol. 2, Plenum Press, 353–364 (1984), teach that partially cured polyimide films made from pyromellitic dianhydride and 4,4'-oxydianiline can be wet etched with potassium hydroxide.

Saiki et al., Polyimides, Vol. 2, Plenum Press, 827–839 (1984), teach that an alcohol solution of tetramethylammonium hydroxide is the most suitable etchant for a polyimide reported as polyimide isoindoloquinazolinedione (PIQ). However, high levels of alcohol in the presence of hydroxide etchants can dissolve the photoresist material. Further, this reference also teaches that an aqueous solution of tetramethylammonium hydroxide has no potential for future etching processes.

U.S. Pat. No. 4,276,186 discloses a cleaning composition which includes N-methyl-2-pyrrolidone (NMP) and an alkanolamine for removing solder flux from a substrate. This reference is directed to stripping (or completely removing) a particular material from a substrate. On the other hand, the present invention is directed to selectively removing predetermined areas of polyamic acid coating.

U.S. Pat. No. 4,592,787 discloses a composition for stripping cross-linked photoresist material (i.e. a negative photoresist material). The present invention is intended to avoid stripping unexposed positive photoresist material while, at the same time, selectively removing the polyamic acid.

While these references disclose wet-etch compositions for polyimides, there is no disclosure of the wet-etch composition of the present invention and no teaching that such a wet-etch composition will etch polyimides that are not completely etched in the usual ionic base wet-etch compositions.

Accordingly, it is an object of the present invention to provide an improved wet-etch process and a composition therefor. This and other objects and advantages of the present invention will be apparent to those skilled in the art from the following description.

DESCRIPTION OF THE INVENTION

The present invention provides a novel composition to selectively wet-etch polyamic acids and partially cured polyamic acids. The wet-etch composition comprises an aqueous solution of at least 50 weight percent water, a substituted hydrocarbon solvent, less than 1 weight percent of an ionic base, and a non-ionic base that is strong enough to deprotonate a polyamic acid or a partially cured polyamic acid.

The present invention further provides a process for etching polyamic acids or partially cured polyamic acids. The process is carried out by contacting preselected areas of the polyamic acid or partially cured polyamic acid with an aqueous solution of at least 50 weight percent water, a substituted hydrocarbon solvent, less than about 1.0 weight percent of an ionic base, and a non-ionic base that is strong enough to deprotonate a polyamic acid or a partially cured polyamic acid. The wet-etch process is accomplished with either a one- or a two-step procedure. In the one-step procedure, a small amount of an ionic base is added to the wet-etch composition in order to etch the exposed photoresist material and the polyamic acid in a single step. In the two-step procedure, only non-ionic base is added to the wet-etch composition.

The novel wet-etch compositions of the present invention are useful in electronic applications to wet-etch patterns or vias in polyamic acids and partially cured polyamic acids.

Generally, polyamic acids that can be etched with the wet-etch composition of the present invention include the polyamic acid corresponding to the polyimide having recurring units of Formula I

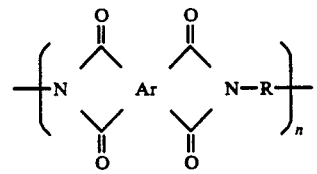

where Ar is at least one tetravalent aromatic nucleus; R is a divalent hydrocarbon moiety which can be an aromatic or aliphatic moiety or an amine-terminated poly(dialkylsiloxane) moiety; and n is an integer representing the number of repeating units to provide a molecular weight usually about 1,000 to about 100,000 daltons. Ar and R may be substituted or unsubstituted, for example, with an alkyl group of 1 to 4 carbon atoms or halogen.

Specifically, the amic acids which can be wet etched with the composition of the present invention include polyamic acids having recurring units of Formula II

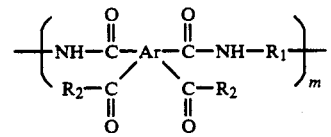

wherein Ar is defined above; $R_1$ is a divalent hydrocarbon moiety which can be an aromatic or aliphatic moiety or an amine-terminated poly(dialkylsiloxane) moiety; $R_2$ is independently selected from halogen, —OH, and —$OR_3$; $R_3$ is an alkyl group of 1 to 4 carbon atoms or halogen; and m is an integer representing the number of repeating units to provide a molecular weight usually about 1,000 to about 100,000 daltons. $R_1$, $R_2$, and $R_3$ may be substituted or unsubstituted, for example, with an alkyl group of 1 to 4 carbon atoms or halogen.

The wet-etch compositions of the present invention will etch polyamic acid or partially cured polyamic acid.

In greater detail, the aromatic moieties, Ar in Formulas I and II, are individually characterized by a single aromatic ring or by two or more such rings which are fused together or are joined by one or more stable linkages, such as a covalent carbon-carbon bond, oxy, sulfonyl, carbonyl, alkylene, and the like. The aromatic moiety, Ar, can include tetravalent moieties of benzene, naphthalene, phenanthrene, anthracene, and the like. Further, the aromatic rings can be unsubstituted or substituted, for example, with one or more lower alkyl groups or halogen.

Specific examples of suitable Ar moieties include

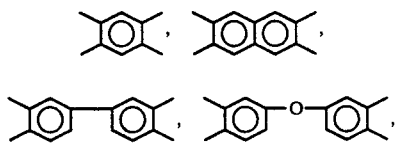

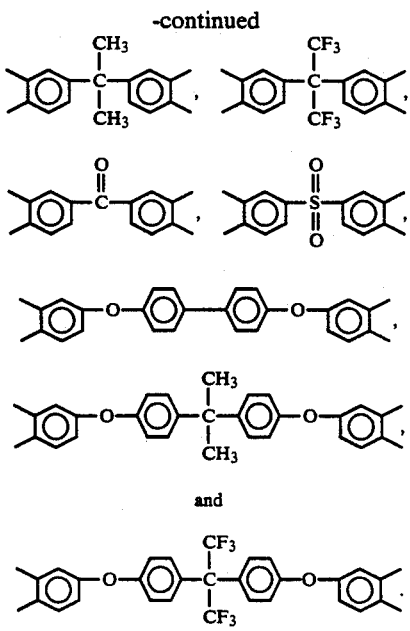

The divalent hydrocarbon moieties, R and $R_1$ in Formulas I and II, are individually selected from an aliphatic or an aromatic moiety. The aliphatic moiety is characterized by a straight or branched-chain hydrocarbon, such as, for example, methylene, ethylene, propylene, tetramethylene, hexamethylene, octamethylene, nonamethylene, decamethylene, dodecamethylene, and the like, which can be unsubstituted or substituted with one or more halide or lower alkyl groups such as, for example, 2,2,4-trimethylhexamethylene, 2,2-dimethylpropylene, and the like.

The aromatic moiety, R and $R_1$ in Formulas I and II, is characterized by a single aromatic ring or by two or more such rings which are fused together or are joined by one or more stable linkages, such as a covalent carbon-carbon bond, oxy, sulfonyl, carbonyl, alkylene, and the like. The aromatic moiety can include divalent moieties of benzene, naphthalene, phenanthrene, anthracene, and the like. Further, the aromatic rings can be unsubstituted or substituted, for example, with one or more halide or lower alkyl groups.

The poly(dialkylsiloxane) moieties useful in this invention are typically obtained from siloxane-containing diamines having from 1 to about 40 disubstituted siloxyl units. Suitable siloxane diamines include bis-aminopropyl polydimethylsiloxane, bis-aminopropyl polydiethylsiloxane, bis-aminopropyl polydipropylsiloxane, diphenyl siloxanes, and the like.

Commercially available polyamic acids which can be etched by the wet-etch composition of the present invention are available from, for example, Ethyl Corporation (sold under the tradename Eymyd Coatings).

The following abbreviations as used herein are defined as follows:

| ABBREVIATION | FULL NAME |
|---|---|
| APBP | 4,4'-bis(p-aminophenoxy)biphenyl |
| BAA | 2,2-bis(4-aminophenyl)propane |
| BDAF | 2,2'-bis(4-(4-aminophenoxy)phenyl)-hexafluoropropane |
| BPDA | 3,3',4,4'-tetracarboxybiphenyl dianhydride |
| BuOH | butanol |
| CODA | 4,4'-diamino-3-carboxamidodiphenylether |
| DABF | 3,5-diaminobenzotrifluoride |
| DATB | 3,5-diamino-t-butylbenzene |
| DMAE | N,N-dimethylethanolamine |
| EtOH | ethanol |
| 6FDA | 2,2-bis(3,4-dicarboxyphenyl)-hexafluoropropane dianhydride |
| IPAN | 2,2-bis(3,4-dicarboxyphenyl)propane dianhydride |
| MEK | methylethylketone |
| MeOH | methanol |
| NaOH | sodium hydroxide |
| NMP | N-methylpyrrolidone |
| OBA | 4,4'-diaminodiphenylether |
| OPAN | bis(3,4-dicarboxyphenyl)ether dianhydride |
| PEG | polyethylene glycol |
| PMDA | pyromellitic dianhydride |
| PPG | polypropylene glycol |
| PVME | polyvinylmethyl ether |
| SILOXANE | bis-aminopropyl polydimethylsiloxane |
| TEA | triethanolamine |
| TEyA | triethylamine |
| THAM | tri(hydroxymethyl)aminomethane |
| TMA | trimethylamine |
| TMAH | tetramethylammonium hydroxide |

The wet-etch composition of the present invention requires the presence of a major portion of water, at least 50 weight percent, less than 1 weight percent ionic base, a substituted hydrocarbon solvent, such as alcohol, and a non-ionic base that is strong enough to deprotonate a polyamic acid or a partially cured polyamic acid.

The substituted hydrocarbon solvent is a polar aliphatic hydroxy compound having from 1 to 4 hydroxy (OH) groups and from 1 to 12 carbon atoms which can include, for example, alcohols, ether alcohols, glycols, and the like.

The identity and concentration of the substituted hydrocarbon solvent will vary according to the non-ionic base chosen. However, the polyamic acid salt that is formed by the reaction of the polyamic acid and the non-ionic base must be soluble in the wet-etch composition. Otherwise, the polyamic acid salt may form at the polymer/solution interface, but the salt will not be removed from the interface area.

Further, the substituted hydrocarbon solvent must be miscible in the aqueous solution in the concentration in which it is added to give an essentially homogeneous solution. The substituted hydrocarbon solvent is believed to penetrate the polyamic acid at the polymer/solution interface and cause the polyamic acid to swell, thus allowing the non-ionic base to more efficiently react with the amic acid moieties.

The concentration of the substituted hydrocarbon solvent can range from about 0.1 to about 49 weight percent of the total wet-etch composition. However, as will be discussed in greater detail below, the concentration and identity of the alcohol can be adjusted to provide a stronger or weaker wet-etch composition and will depend on the particular polyamic acid being etched.

Care must be taken to keep the concentration of the substituted hydrocarbon solvent low enough that it will not attack the unexposed photoresist material. As the concentration of the substituted hydrocarbon solvent increases the corresponding solvent character of the composition increases. When the substituted hydrocarbon solvent concentration reaches approximately 50 weight percent (of the total wet-etch composition) the composition takes on a pronounced solvent character and begins to dissolve the protective photoresist material. In other words, selectivity is lost when the composition contains 50 weight percent or more of the substituted hydrocarbon solvent.

The substituted hydrocarbon solvent can be a single solvent or a cosolvent system where two or more solvents form the substituted hydrocarbon solvent component of the wet-etch composition. For example, an ethanol/methanol or a ethanol/2-2-ethoxyethoxyethanol cosolvent system can form the substituted hydrocarbon solvent component of the present invention.

Alcohol is well suited as a substituted hydrocarbon solvent. The concentration of the alcohol can be adjusted, depending on the polymer composition, to provide a substantially complete etch. A complete etch occurs when the polyamic acid is completely removed from the vias leaving a smooth etch profile having the desired wall slope. This can occur in a time period that can range between about 5 seconds and about 30 minutes. In order to increase the etch rate, stronger etch compositions can be used; however, faster etch rates can be difficult to control, and slower etch rates can attack the photoresist material. Stronger etch compositions generally can be prepared by incorporating higher concentrations of alcohol or alcohols having longer substituted hydrocarbon chains. However, care must be taken to keep the concentration of the substituted hydrocarbon solvent low enough that it will not attack the unexposed photoresist material.

Suitable alcohols that are useful in the wet-etch composition of the present invention include straight or branched alcohols having from 1 to about 12 carbon atoms and at least one OH group, for example, methanol, ethanol, propanol, i-propanol, butanol, i-butanol, s-butanol, t-butanol, and the like.

Water functions to dilute the substituted hydrocarbon solvent but also functions to inhibit dissolution of the protective layer of positive photoresist material. The positive photoresist material, typically a non-polar phenolic resin, does not dissolve in water but has been found to dissolve in acetone and NMP. If the protective pattern of photoresist material is allowed to dissolve, the polyamic acid coating will be removed and the desired vias through the polymer coating can not be created. It has been determined that a wet-etch composition having less than 50 weight percent (of the total wet-etch composition) water will not provide an acceptable via etch (for example, see Comparative Examples A-F).

The non-ionic base component of the etchant composition must effectively deprotonate the polyamic acid. A non-ionic base is one that generally remains uncharged in an aqueous solution, and an ionic base is one that is predominantly ionized in aqueous solutions. Further, the non-ionic base must be essentially miscible in the concentration in which it is added to the aqueous solution of the wet-etch composition.

Carboxylic acid groups are deprotonated to form a soluble polyamate salt. Ionic base etchants, such as sodium hydroxide or tetramethylammonium hydroxide (TMAH), act by deprotonating the polyamic acid to form the sodium or TMAH salt of the polyamic acid. On the other hand, a non-ionic base, such as a trialkylamine, deprotonates the polyamic acid to give a trialkylammonium salt.

Suitable non-ionic bases are alkylamines having from 1 to 12 carbon atoms and at least one nitrogen atom. However, the non-ionic base includes any non-ionic base that is strong enough to deprotonate the polyamic acid. Particularly useful non-ionic bases include an amine group as the reactive point of the molecule. Further, the non-ionic base can be substituted with hydrogen, carbon, alcohol moieties, or other substituents which do not prevent the base from deprotonating the polyamic acid.

The concentration of the non-ionic base in the wet-etch composition of the present invention can range from about 0.1 to about 49 weight percent of the total wet-etch composition. Typically the concentration of the non-ionic base is from about 0.06 to about 0.007 moles per liter of etchant solution for a 0.1 weight percent composition and from about 2.8 to about 3.3 moles per liter of etchant solution for a 49 weight percent composition. The concentration must be high enough to achieve an etch, but not so high that the etch rate can not be controlled. Further, the concentration can be adjusted to provide a substantially complete etch. As was discussed in connection with the alcohol, increasing the concentration of the non-ionic base increases the etch strength, and different bases can give different etch rates. Thus, the strength of the wet-etch composition can be adjusted to achieve the desired etch rate and profile for a particular polymer.

Non-ionic bases useful in the composition of the present invention include tri(hydroxymethyl)aminomethane trimethylamine, triethylamine, tripropylamine, triisopropylamine, tributylamine, methylamine, ethylamine, propylamine, isopropylamine, butylamine, dimethylamine, diethylamine, dipropylamine, diisopropylamine, dibutylamine, ethylenediamine, diethylenetriamine, triethylenetetraamine, triethanolamine, N,N-diethylethanolamine, N,N-dimethylethanolamine, ethanolamine, diethylaminoacetaldehyde diethyl acetal, dimethylaminoacetaldehyde dimethyl acetal, and tri(isopropanol)amine. Triethylamine, trimethylamine, triethanolamine, and N,N-dimethylethanolamine have been found to provide particularly good etch in polyamic acids that are not generally etched by the hydroxide-based etchants.

It has been found that the presence of an aggressive ionic base, such as NaOH, is detrimental to the wet-etch process (see Comparative Examples G-M). However, a small amount (less than 1 weight percent) of a less aggressive base, such as TMAH, can be present in the wet-etch composition of the present invention (see Examples 23-26 and Comparative Examples N-O). In this case, both the exposed positive photoresist material and the polyamic acid can be etched in a single step. However, as the concentration of the ionic base decreases the etch rate decreases and at an ionic base concentration below approximately 0.25 weight percent of the total composition the exposed photoresist material is not removed.

Processing polyimides, for example, in the case of polyimide coated integrated circuits, requires a multi-step procedure. Polyimides are generally made by dissolving a diamine in a compatible solvent and then adding a dianhydride which reacts with the diamine to form a solution of polyamic acid. The resulting solution of polyamic acid is spread on a substrate to form a coating. The polyamic acid coating is further coated with a positive photoresist material which itself is in a solvent and that solvent is removed, typically by heating (also called soft baking). The photoresist material is then shielded with a mask containing a pattern of openings, and the photoresist material is exposed to actinic radiation, typically UV light. Thus, the photoresist material is photochemically altered such that the areas that were exposed to actinic radiation are soluble and vias (or openings) are created by taking advantage of this selective solubility to develop and remove specific areas of photoresist material. The polyamic acid coating can then be etched either along with the development and removal of the photoresist material (see, for example, Examples 23-26) or through the vias created in the photoresist material (see, for example, Examples 1-22). After the polyamic acid is etched, the unexposed photoresist material is removed, and the remaining polyamic acid is imidized, generally by heating in a range of from about 200° C. to about 400° C., to form the final coating. The vias (or openings) through the polymer coating permit access for electrical connections between the substrate and the outside environment or between subsequent layers.

Thus, wet-etching can be viewed as a process to dissolve selected areas of polyamic acid coating on a substrate with an appropriate solvent to form patterns or vias (openings) in the coating. In general, the etching process leaves areas of undissolved polyamic acid over some of the substrate while dissolving and removing polyamic acid over other areas of the substrate, to form a pattern of undissolved polyamic acid over the substrate.

In greater detail, polyimide polymers are typically made by dissolving an aromatic diamine in a polar aprotic solvent, such as N-methylpyrrolidone (NMP) or N,N-dimethylacetamide, and adding a dianhydride which reacts with the diamine to form a solution of polyamic acid. The solution of polyamic acid is diluted and spread on a substrate. The polyamic acid is then soft-cured (i.e., the solvent is evaporated from the polyamic acid solution), usually at an elevated temperature of about 75° C. to about 150° C. It is generally desirable to cure the polyamic acid just enough to remove the solvent since a high temperature cure can promote imidization of the polymer, thus making the polyamic acid more difficult to wet etch. In some cases, the substrate is coated with an adhesion promoter before applying the polyamic acid coating. Commercially available adhesion promoters include, for example, aminopropyltriethoxysilane (APES) which is available from Aldrich.

In general, the degree of dilution of the polyamic acid solution with polar aprotic solvent, such as NMP, is based on the thickness requirement of the final coating, the viscosity, and solids content of the solution. Solutions of the polyamic acid polymer generally range from about 5 to about 50 weight percent of the total solution, preferably from about 10 to about 40 weight percent of the total solution. Above 50 weight percent, the polyamic acid solution is generally too viscous to spread at a reasonable spin speed, and below 5 weight percent, the solution is not viscous enough to get the desired thickness at a reasonable spin speed.

The spin curve data which is used to determine the spin speed can be obtained by spin-coating the polymer onto the substrate at various spin speeds, measuring the resulting thickness, and plotting thickness versus spin speed. Clean, dry, high-purity solvent is generally used as the diluent. The diluted solution is generally filtered before further processing.

The polyamic acid solution can be applied either statically or dynamically. In static application, the polyamic acid solution is dispensed to a nonrotating substrate and spread across the surface by spinning. In dynamic application, the polyamic acid solution is dispensed to a rotating substrate. In either case, the substrate is spun at a spin speed which is determined from the spin curve for the final coating thickness required.

Whichever application method is used, the substrate is then spun at a spin speed determined from spin curve data which is calculated to achieve the final coating thickness required. The coating is typically thin, between about 1 and about 30 microns in thickness. The polyamic acid is coated on the substrate and soft baked to remove solvent. The polyamic acid-coated substrate is then coated with the positive photoresist material (for example, a commercially available, light sensitive polymer is available from Hoechst AG under the tradename AZ 1350J ®), and the coated substrate is heated at an elevated temperature (from about 75° C. to about 150° C.) to remove the solvents from the photoresist material.

The photoresist material is then covered with a mask containing a pattern of vias (or openings) which are positioned where vias are desired in the polyamic acid coating. The photoresist material is thereafter exposed to actinic radiation to convert the photoresist material by photochemical reaction from an insoluble material to one that is soluble in basic aqueous developer solvents. Thus, photoresist material can be selectively removed to form vias that uncover the polyamic acid coating.

The exposed photoresist material is typically developed (or dissolved and removed), for example, by an aqueous solution of tetramethylammonium hydroxide (TMAH), which is commercially available under the trademark Shipley ® 312. The developer solution forms water soluble salts with the exposed photoresist material and effectively allows the exposed photoresist material to be washed away. The unexposed photoresist material is not soluble in the aqueous base; therefore, the polyamic acid material that is underneath the unexposed photoresist material is protected from the aqueous base by the layer of unexposed photoresist material.

Using the wet-etch composition of the present invention, the polyamic acid can now be selectively etched through the vias in the photoresist material. For a coating application, this requires etching vias or openings through the polymer coatings to permit access for electrical connections between the substrate and the outside environment. These openings are typically 50 to 500 microns but can be as small as 1 micron.

The polyamic acid coating which had been located under the exposed photoresist material is now uncovered and can be etched with the wet-etch composition of the present invention. The wet-etch composition is generally maintained at a temperature of from about 0° C. to about 60° C. The polymer is etched such that the polyimide is dissolved in a radiating pattern that is essentially equidistant in all directions from the exposed surface. Therefore, the depth of the etch can be indirectly determined by monitoring the extent of removal of the polyimide as it undercuts the pattern-forming edge of the photoresist material.

There are at least two wet-etch application procedures; dip-etching and spray-etching. In dip-etching, a wafer is dipped into a container of the wet-etch composition and the polyamic acid is allowed to dissolve. The polymer effectively dissolves as an infinite dilution. In spray-etching, a mist of etchant is applied to the surface of a slowly rotating (about 500 rpm) polyamic acid coated substrate. In this manner, fresh etchant is continually delivered to the surface, and dissolved polymer is continually being spun off. A particular etchant may not work equally well in both the dip-etch and spray-etch method. Also, mechanical agitation will affect the outcome of the dip-etch application procedure.

After the polyamic acid coating is wet etched, the remaining photoresist material is removed (stripped).

Finally, the polyamic acid is fully imidized to make the polyimide layer or coating. Imidization is typically accomplished at an elevated temperature, generally in a range of from about 150° C. to about 400° C.

The wet-etch composition of the present invention can further include a polymer additive with surfactant properties, for example, polyvinylmethyl ether (PVME). It is believed that the surfactant functions as a wetting agent to wet the polymer surface which can result in a more constant etch rate and can lead to smoother polymer-etch profile. Suitable activity has been observed when the surfactant is added to the etch composition at approximately 0.01 to approximately 1.0 weight percent of the total wet-etch composition.

Polymer additives with surfactant properties include, for example, a salt of an aliphatic carboxylic acid or sulfonic acid, a polyvinyl alcohol, or a polyvinyl ether. Suitable polymer additives are polyvinylmethyl ether (PVME), polyethylene glycol (PEG), and polypropylene glycol (PPG). Most preferred is PVME because it has been found to provide a smooth polymer-etch profile.

The following examples will serve to illustrate certain embodiments of the herein disclosed invention. These examples should not, however, be construed as limiting the scope of the invention as there are many variations which may be made thereon without departing from the spirit of the disclosed invention, as those of skill in the art will recognize.

EXAMPLES

All percents used are weight percents of the total wet-etch composition.

The polymer was etched such that the polyamic acid was dissolved in a radiating pattern that was essentially equidistant in all directions from the exposed surface; therefore, the depth of the etch was determined by monitoring the extent of removal of the polyimide as it undercut the pattern-forming edge of the photoresist material. The etch rate was determined by measuring the undercut as a function of etch time.

EXAMPLE 1

A 15% (by weight) solution of 2,2-bis(3,4-dicarboxyphenyl)-hexafluoropropane dianhydride/4,4'-bis(p-aminophenoxy)biphenyl/2,2-bis(4-aminophenyl)propane (6FDA/APBP/BAA) polyamic acid in N-methylpyrrolidone (NMP) was dispensed onto silicon wafers, and the wafers were spun to form an essentially uniform polymer layer approximately 5 microns thick. The samples were soft-cured either on a hot plate or in a nitrogen-purged oven. Cure times ranged from about 2 to about 12 minutes at 100° C.

A positive photoresist material (Shipley 1813) was dynamically dispensed on the polymer layer of each sample, and the wafers were spun at approximately 4000 rpm for approximately 30 seconds to obtain a photoresist material thickness of approximately 1.2 microns. In this case, if the photoresist material had been allowed to puddle on the wafer (i.e., statically dispensed), the photoresist material could have attacked the partially cured polyimide and caused the polyimide to crack. The silicon wafers, coated with polymer and photoresist material, were heated on a hot plate or in a nitrogen-purged oven for 10 minutes at 100° C.

The photoresist material was then exposed to ultraviolet (UV) light for approximately 4 seconds on a Karl Suss MJB3 mask aligner, 15 mW/cm at 405 nm, spectral output range 350-450 nm.

The photoresist material was developed in a 0.1M aqueous TMAH bath (Shipley 351) which was maintained at 22° C. for 30 seconds to form a patterned fluorinated polyimide. The polyimide was then etched in a wet-etch composition of 0.3M (4.4 weight percent) triethanolamine (TEA), 75.6 weight percent water and 20 weight percent methanol which was maintained at 50° C. This was a two-step procedure: a first step to develop the photoresist material and a second step to etch the polyamic acid. The polymer etch rate was 43 microns/minute at 50° C. The photoresist material was removed and the coated wafers were post-baked at 100° C. for 1 hour, 200° C. for 1 hour, and 350° C. for 1 hour. The process formed an etched polyimide with gently sloping walls.

EXAMPLE 2

The procedure of Example 1 was repeated using 6FDA/APBP/BAA polyamic acid coated with a 1.2 micron layer of photoresist material. The photoresist material was developed by immersing the wafer in a 0.1M aqueous TMAH bath, maintained at 22° C. for 30 seconds, followed by a 60-second rinse in deionized water. The polymer was then etched in a wet-etch composition of 0.3M (4.4%) triethanolamine, 75.5% water, 20% methanol and 0.1% polyvinylmethyl ether (PVME) for approximately 12 seconds at 37° C., followed by a 60-second rinse with deionized water.

The addition of the surfactant PVME increased the etch rate. At 37° C., the etch rate using the surfactant PVME was 35 microns/minute. When this same polymer was etched in a wet-etch composition that did not contain the surfactant, the etch rate was 10 microns/minute at 37° C.

EXAMPLE 3

The procedure described in Example 1 was repeated for Example 3, with the exception that the parameters were as indicated on Table 1. The etch rate for Examples 1-3 is reported in Table 1.

TABLE 1

| Example Number | Etch Composition wt. %[1] | Polyamic Acid | Etch Temp. (°C.) | Etch Rate (Micron/Mins) |
|---|---|---|---|---|
| 1 | 4.4% TEA<br>20% MeOH<br>75.6% water | 6FDA<br>APBP<br>BAA | 50 | 43 |
| 2 | 4.4% TEA<br>20% MeOH<br>0.1% PVME<br>75.5% water | 6FDA<br>APBP<br>BAA | 37 | 35 |
| 3 | 4.4% TEA<br>20% MeOH<br>1.0% PVME<br>74.6% water | 6FDA<br>APBP<br>BAA | 37 | 45 |

1. Wt. % of the total composition.

EXAMPLES 4-20

In Examples 4-20, the wet-etch compositions were prepared in a manner similar to Example 1 above. The polyamic acid was applied to form a coating thickness of approximately 5 microns. The wet-etch composition bath was maintained at a temperature that ranged from about 22° C. to about 50° C. The etch rates were found to be between from about 1 micron/min and about 53.1 micron/min. The etch temperatures and etch rates are reported in table IV below.

Table II illustrates Examples 4-20 in order of increasing etch strength. Table III indicates Polyamic Acids Designated A through T in order of increasing etch difficulty. As the concentration of amic acid moiety decreases or the concentration of hydrophobic substituents increases, the polyamic acid becomes increasingly difficult to etch and a stronger wet-etch composition will be required. However, a wet-etch composition that is overly aggressive can provide an uncontrollably fast etch and result in poor etch definition. Therefore, a wet-etch composition should be selected to provide a controllable etch rate for a given polyamic acid.

TABLE II

| EXAMPLE NUMBER | WET-ETCH COMPOSITION |
|---|---|
| 4 | 1.5% TMAH |
|   | 98.5% water |
| 5 | 1.5% TMAH |
|   | 20% MeOH |
|   | 78.5% water |
| 6 | 2.4% TEA |
|   | 20% MeOH |
|   | 77.6% water |
| 7 | 4.4% TEA |
|   | 20% MeOH |
|   | 75.6% water |
| 8 | 4.4% TEA |
|   | 20% MeOH |
|   | 1.0% PVME |
|   | 74.6% water |
| 9 | 4.4% TEA |
|   | 20% EtOH |
|   | 0.1% PVME |
|   | 75.5% water |
| 10 | 4.4% TEA |
|   | 30% EtOH |
|   | 0.1% PVME |
|   | 65.5% water |
| 11 | 3.6% THAM |
|   | 35% EtOH |
|   | 5% BuOH |
|   | 0.1% PVME |
|   | 56.3% water |
| 12 | 4.4% TEA |
|   | 40% EtOH |
|   | 0.1% PVME |
|   | 55.5% water |
| 13 | 4.4% TEA |
|   | 35% EtOH |
|   | 5% BuOH |
|   | 0.1% PVME |
|   | 55.5% water |
| 14 | 4.4% TEA |
|   | 10% MeOH |
|   | 10% BuOH |
|   | 0.1% PVME |
|   | 75.5% water |
| 15 | 4.4% TEA |
|   | 10% EtOH |
|   | 10% BuOH |
|   | 0.1% PVME |
|   | 75.5% water |
| 16 | 3.0% TEyA |
|   | 20% MeOH |
|   | 0.1% PVME |
|   | 76.9% water |
| 17 | 3.0% TEyA |
|   | 20% EtOH |
|   | 0.1% PVME |
|   | 76.9% water |
| 18 | 3.0% TEyA |
|   | 40% EtOH |
|   | 0.1% PVME |
|   | 56.9% water |
| 19 | 1.8% TMA |
|   | 35% EtOH |
|   | 5% BuOH |
|   | 0.1% PVME |
|   | 58.1% water |
| 20 | 3.0% TEyA |
|   | 35% EtOH |
|   | 5% BuOH |
|   | 0.1% PVME |
|   | 56.9% water |

TABLE III

| POLYAMIC ACID DESIGNATION | POLYAMIC ACID COMPOSITION | INHERENT VISCOSITY (dl/g) |
|---|---|---|
| A | 6FDA/DABF | 0.68 |
| B | 6FDA/DATB | 0.50 |
| C | 6FDA/OBA | 1.35 |
| D | 6FDA/BAA | 1.36 |
| E | 6FDA/25% APBP 75% BAA | 1.06 |
| F | 6FDA/50% APBP 50% BAA | 1.02 |
| G | 6FDA/75% APBP 25% BAA | 0.99 |
| H | 6FDA/ APBP with 50 EtOH | 0.52 |
| I | 6FDA/ APBP in ethyl carbitol | 0.78 |
| J | 6FDA/ APBP with 25% EtOH 2% excess APBP in diglyme | — |
| K | 6FDA/BAP | 0.89 |
| L | 6FDA/90% APBP 10% CODA | 1.35 |
| M | 6FDA/APBP | 1.19 |
| N | 6FDA/APBP | 1.29 |
| O | IPAN/APBP | 1.41 |
| P | OPAN/APBP | 1.97 |
| Q | 6FDA/BDAF | — |
| R | BPDA/APBP 2% excess APBP | 1.23 |
| S | PMDA/APBP | 1.09 |
| T | PMDA/BDAF | — |

TABLE IV reports the etch rates found for various polyamic acids.

TABLE IV

| EXAMPLE NUMBER | DUPLICATE RUNS | POLYAMIC ACID DESIGNATION | ETCH TEMP. (°C.) | ETCH RATE (micron/min) |
|---|---|---|---|---|
| 4 | a | A | 22 | 6.2 |
|   | b | B | 22 | 2.3 |
|   | c | C | 22 | <1 |
| 5 | a | D | 22 | 13 |

TABLE IV-continued

| EXAMPLE NUMBER | DUPLICATE RUNS | POLYAMIC ACID DESIGNATION | ETCH TEMP. (°C.) | ETCH RATE (micron/min) |
|---|---|---|---|---|
| 6 | a | E | 22 | 5.5 |
| 7 | a | E | 22 | 20.5 |
|   | b | F | 37 | 9.2 |
|   | c | F | 40 | 20.7 |
|   | d | F | 50 | 53.1 |
| 8 | a | F | 37 | 17.6 |
|   | b | G | 50 | 46 |
| 9 | a | H | 37 | 9.2 |
| 10 | a | I | 22 | 13.7 |
|   | b | J | 22 | 6.1 |
|   | c | K | 22 | 6.4 |
|   | d | L | 22 | 4.6 |
|   | e | M | 22 | 13.9 |
|   | f | M | 22 | 7 |
|   | g | N | 22 | 8.8 |
| 11 | a | N | 22 | 7.4 |
| 12 | a | J | 22 | 11.0 |
|   | b | M | 22 | 9.2 |
|   | c | N | 22 | 9.2 |
| 13 | a | K | 22 | 12.8 |
|   | b | M | 22 | 13.5 |
|   | c | M | 22 | 13.5 |
|   | d | O | 22 | 9.2 |
|   | 3 | P | 22 | 35.7 |
| 14 | a | H | 22 | 28.8 |
|   | b | N | 22 | 67.6 |
| 15 | a | H | 22 | 40.6 |
| 16 | a | H | 22 | 2.3 |
| 17 | a | J | 22 | 13.9 |
|   | b | K | 22 | 12.4 |
|   | c | O | 22 | 27.1 |
| 18 | a | P | 22 | 13.9 |
|   | b | R | 22 | 10.4 |
|   | c | S | 22 | 13.8 |
| 19 | a | N | 22 | 17.9 |
| 20 | a | N | 22 | 41.4 |
|   | b | P | 22 | 17.4 |
|   | c | R | 22 | 18.4 |
|   | d | S | 22 | 15.3 |
|   | e | T | 22 | 15.3 |
|   | f | U | 22 | 5.8 |

Table V illustrates the relationship between the increasing wet-etch composition strength (Examples 4-20) and polyamic acids that are increasingly difficult to etch (Polyamic Acid Designations A-T). In this case, the samples were visually examined (under magnification) and assigned qualitative measures of "good" or "excellent" based on the appearance of the etched vias. An excellent designation indicates an unusually high resolution etch which has minimal undercut (anisotropy). A good designation indicates an etch that is normal in resolution due to isotropy.

To choose an appropriate wet-etch composition for a new polymer, compare the structure of the new polymer (taking into consideration the degree of dilution of the amic acid moiety and the degree of hydrophobic substituents) to the structure of the Polyamic Acids Designated A-T and select an analogous Polyamic Acid A-T. The wet-etch composition 4-20 that etched the analogous structure generally will be suitable for the new polymer.

TABLE V

WET-ETCH COMPOSITIONS (EXAMPLE 4-20) COMPARED TO POLYAMIC ACIDS DESIGNATIED A-T

|   | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|
| A | X |   |   |   |   |   |   |   |   |   |   |   |   |   |   |   |   |
| B | X |   |   |   |   |   |   |   |   |   |   |   |   |   |   |   |   |
| C | X |   |   |   |   |   |   |   |   |   |   |   |   |   |   |   |   |
| D |   | X |   |   |   |   |   |   |   |   |   |   |   |   |   |   |   |
| E |   | X | X |   |   |   |   |   |   |   |   |   |   |   |   |   |   |
| F |   |   |   | X | X |   |   |   |   |   |   |   |   |   |   |   |   |
| G |   |   |   |   | X |   |   |   |   |   |   |   |   |   |   |   |   |
| H |   |   |   |   |   | E |   |   |   |   |   | E | X | E |   |   |   |
| I |   |   |   |   |   |   | E |   |   |   |   |   |   |   |   |   |   |
| J |   |   |   |   |   |   | E | E |   |   |   |   |   | E |   |   |   |
| K |   |   |   |   |   |   | X |   |   | X |   |   |   | X |   |   |   |
| L |   |   |   |   |   |   | X |   |   |   |   |   |   |   |   |   |   |
| M |   |   |   |   |   |   | X |   | X | E |   |   |   |   |   |   |   |
| N |   |   |   |   |   |   | X | E | E |   | X |   |   |   |   | X | X |
| O |   |   |   |   |   |   |   |   |   | X |   |   |   | X |   |   |   |
| P |   |   |   |   |   |   |   |   |   | X |   |   |   |   | E |   | X |

TABLE V-continued
WET-ETCH COMPOSITIONS (EXAMPLE 4–20) COMPARED TO POLYAMIC ACIDS DESIGNATIED A–T

| | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|
| Q | | | | | | | | | | | | | | | E | | E |
| R | | | | | | | | | | | | | | | X | | X |
| S | | | | | | | | | | | | | | | | | X |
| T | | | | | | | | | | | | | | | | | X |

X designates a good etch
E designates an excellent etch

EXAMPLES 21–22

In Examples 21–22, the wet-etch compositions were prepared in a manner similar to Example 1 above. The polyamic acid was applied to form a coating thickness of approximately 5 microns. The wet-etch composition bath was maintained at ambient temperature, and the etch time was approximately 30 seconds. A comparison of etch quality is reported in Table VI below.

COMPARATIVE EXAMPLES A–F

In Comparative Examples A–F, the wet-etch compositions were prepared in a manner similar to Example 1 above. The polyamic acid was applied to form a coating thickness of approximately 5 microns. The wet-etch composition bath was maintained at ambient temperature and the etch time was approximately 30 seconds. A comparison of etch quality is reported in Table VI below.

TABLE VI

| Example Number | Polyamic Acid Composition | Wet-Etch Composition[1] | Etch Quality |
|---|---|---|---|
| 21 | OPAN/APBP | 2.7% DMAE<br>35% EtOH<br>5% BuOH<br>0.1% PVME<br>57.2% water | E[2] |
| 22 | 6FDA/APBP | 2.7% DMAE<br>35% EtOH<br>5% BuOH<br>0.1% PVME<br>57.2% water | E |
| A | OPAN/APBP | 4.4% TEA<br>45.4% EtOH<br>0.1% PVME<br>50.1% water | CR[3] |
| B | 6FDA/APBP | 4.4% TEA<br>45.4% EtOH<br>0.1% PVME<br>50.1% water | CR |
| C | OPAN/APBP | 2.7% TEA<br>47.1% EtOH<br>0.1% PVME<br>50.1% water | Y[4] |
| D | 6FDA/APBP | 2.7% TEA<br>47.1% EtOH<br>0.1% PVME<br>50.1% water | Y |
| E | OPAN/APBP | 2.7% TEA<br>42.1% EtOH<br>5% BuOH<br>0.1% PVME<br>50.1% water | Z[5] |
| F | 6FDA/APBP | 2.7% TEA<br>42.1% EtOH<br>5% BuOH<br>0.1% PVME<br>50.1% water | Z |

1. Wt. % of the total composition.
2. E - designates an excellent etch
3. CR - designates a large network of cracking on the photoresist material surface
4. Y - designates a dense network of cracking (with smaller cracking between) on the surface of the photoresist material
5. Z - designates the beginning of dissolution of the photoresist material surface As can be seen from Table VI, the etch quality is severely effected when the concentration of alcohol is increased and the concentration of water is decreased.

COMPARATIVE EXAMPLES G–R

Comparative Examples G–R were prepared in a manner similar to Example 1 above. A 6FDA/APBP polyamic acid was prepared; 10% solids, IV 2.04 dl/g. The photoresist material was coated on the polyamic acid and exposed to actinic radiation as described in Example 1. An ionic base was added to the wet-etch composition as described in Tables VII and VIII below. The wet-etch bath was maintained at ambient temperature, and the etch time was approximately 30 seconds. The effect of the addition of the ionic base on the photoresist material and the polyamic acid are reported in Tables VII and VIII below.

COMPARATIVE EXAMPLE P

In Comparative Example P, a 6FDA/APBP polyamic acid sample was prepared, coated with a photoresist material, and exposed to UV light as described in Comparative Examples G–R. The prepared sample was then exposed to a commercial photoresist developer containing water and 2.5 wt % of the ionic base TMAH (Shipley MF 312). The exposed photoresist material was removed and the polyamic acid was not dissolved. In other words, an aqueous solution of TMAH did not etch the polyamic acid. See Table VIII below.

EXAMPLES 23–26

Examples 23–26 were prepared and the photoresist material was exposed to UV light as described in Comparative Examples G–R above. The prepared sample was exposed to a wet-etch composition that included a small amount of an ionic base, TMAH. As seen in Table VIII, the exposed photoresist material was removed and the polyamic acid was etched in a single step.

TABLE VII

6FDA/APBP Polyamic Acid Exposed to A Mixed Ionic/Non-Ionic Base

| Example Number | Ionic Base | Cure Type | Wt. % Wet-Etch[1] Composition | Wt. % Ionic Base[2] | Photo-resist | Poly-amic Acid |
|---|---|---|---|---|---|---|
| G | NaOH | OC[3] | 31.8% EtOH<br>2.5% DMAE<br>0.1% PVME<br>65.1% H$_2$O | 0.5 | AR[4] | NS[5] |
| H | NaOH | OC | 33.3% EtOH<br>2.6% DMAE<br>0.1% PVME<br>63.8% H$_2$O | 0.24 | AR | NS |
| I | NaOH | OC | 34.1% EtOH<br>2.6% DMAE<br>0.1% PVME<br>62.9% H$_2$O | 0.13 | AR | Cloudy |
| J | NaOH | HP[6] | 34.4% EtOH<br>2.7% DMAE<br>0.1% PVME | 0.08 | AR | NS |

TABLE VII-continued

6FDA/APBP Polyamic Acid Exposed to A Mixed Ionic/Non-Ionic Base

| Example Number | Ionic Base | Cure Type | Wt. % Wet-Etch[1] Composition | Wt. % Ionic Base[2] | Photo-resist | Poly-amic Acid |
|---|---|---|---|---|---|---|
| K | NaOH | HP | 62.7% H$_2$O<br>34.7% EtOH<br>2.7% DMAE<br>0.1% PVME | 0.05 | AR | Dissolving |
| L | NaOH | HP | 62.5% H$_2$O<br>34.8% EtOH<br>2.7% DMAE<br>0.1% PVME | 0.03 | Slowly Dissolving | Dissolving |
| M | NaOH | HP | 62.4% H$_2$O<br>34.9% EtOH<br>2.7% DMAE<br>0.1% PVME | 0.02 | Slowly Dissolving | NE[7] |

1. Wt. % of the total composition including the ionic base.
2. Wt % of the total composition.
3. OC - Oven cure: 8.1 micron sample; soft cure of polyamic acid 5 min. at 100° C.; photoresist 10 min. at 100° C.
4. AR - Both exposed and unexposed photoresist material was removed (i.e. all photoresist material was removed).
5. NS - Not Soluble
6. Hot plate cure: 6.8 micron sample; soft cure of polyamic acid 1 min. at 100° C.; photoresist 30 sec. at 100° C.
7. NE - Not Exposed (the photoresist material was not removed)

TABLE VIII

6FDA/APBP Polyamic Acid Exposed to A Mixed Ionic/Non-Ionic Base

| Example Number | Ionic Base | Cure Type | Wt. % Wet-Etch[1] Composition | Wt. % Ionic Base[2] | Photo-resist | Poly-amic Acid |
|---|---|---|---|---|---|---|
| 23 | TMAH | OC[3] | 31.8% EtOH<br>2.5% DMAE<br>0.1% PVME<br>65.2% H$_2$O | 0.4 | ER[4] | Excellent Etch |
| 24 | TMAH | HPA[5] | 31.8% EtOH<br>2.5% DMAE<br>0.1% PVME<br>65.2% H$_2$O | 0.4 | ER | Excellent Etch |
| 25 | TMAH | HPB[6] | 32.8% EtOH<br>2.5% DMAE<br>0.1% PVME<br>64.3% H$_2$O | 0.3 | ER | Good Etch |
| 26 | TMAH | HPB | 31.8% EtOH<br>2.5% DMAE<br>0.1% PVME<br>65.2% H$_2$O | 0.4 | ER | Excellent Etch |
| N | TMAH | HPB | 34.3% EtOH<br>2.6% DMAE<br>0.1% PVME<br>62.9% H$_2$O | 0.1 | NS[7] | NE[8] |
| O | TMAH | HPB | 33.9% EtOH<br>2.6% DMAE<br>0.1% PVME<br>63.2% H$_2$O | 0.16 | NS | NE |
| Q | TMAH | HPA | 17.5% EtOH<br>1.35% DMAE<br>0.05% PVME<br>78.6% H$_2$O | 2.5 | AR[9] | NS |
| R | TMAH | HPA | 26.3% EtOH<br>2.0% DMAE<br>0.1% PVME<br>70.4% H$_2$O | 1.2 | AR | Dissolving |

1. Wt. % of the total composition including the ionic base.
2. Wt. % of the total composition.
3. OC - Oven cure: 8.1 micron sample; soft cure of polyamic acid 5 min. at 100° C.; photoresist 10 min. at 100° C.
4. ER - Exposed photoresist material removed.
5. HPA - Hot plate cure A: 6.8 micron sample; soft cure of polyamic acid 1 min. at 100° C; photoresist 30 sec. at 100° C.
6. HPB - Hot plate cure B: 3.4 micron sample; soft cure of polyamic acid 1 min. at 100° C; photoresist 30 sec. at 100° C.
7. NS - Not Soluble
8. NE - Not Exposed (the photoresist material was not removed)
9. AR - Both exposed and unexposed photoresist material was removed (i.e. all photoresist material was removed).

As can be seen from Table VII, the presence of an aggressive ionic base, such as NaOH, in the wet-etch composition of the present invention is detrimental to the wet-etch process. In Comparative Examples G-K, both the exposed and the unexposed positive photoresist material was removed. The exposed positive photoresist material should dissolve but the unexposed positive photoresist material must remain on the polyamic acid to form a pattern of openings through which the polyamic acid can be selectively etched. In comparative Examples G-K, all of the photoresist material was removed and the polyamic acid could not be selectively etched.

As seen from Comparative Examples Q-R, Table VIII, the addition of a large amount (more than 1 weight percent of the total composition) of a less aggressive ionic base removes both the exposed and the unexposed positive photoresist material.

In contrast, in Examples 23-26 a small amount of TMAH (less than about 1.0 weight percent), a less aggressive ionic base, was added to the wet-etch composition of the present invention. In this case, the unexposed photoresist material remained on the polyamic acid, the exposed photoresist material was removed, and the polyamic acid was etched in a single processing step.

However, as seen in Comparative Examples N-O, at a very low concentration of ionic base the exposed photoresist material is not removed and the polyamic acid cannot be etched. As the concentration of the ionic base decreases the etch rate decreases and at an ionic base concentration below approximately 0.25 weight percent of the total composition the exposed photoresist material is not removed.

From these examples it can be seen that in the absence of an ionic base, the wet-etch composition of the present invention did not remove the exposed cured positive photoresist material. On the other hand, in the presence of a small amount of a less aggressive ionic base, such as TMAH, the wet-etch composition of the present invention can be used to etch the exposed positive photoresist material and the polyamic acid in a single step. It is believed that the wet-etch composition of the present invention increases the aggressiveness of the less aggressive ionic base. In this case, the less aggressive ionic base removes the exposed positive photoresist material, does not attack the unexposed positive photoresist material, but does attack the polyamic acid. In this case, vias are created in the photoresist material and the polyamic acid in a single step.

EXAMPLES 27-30

In Examples 27-30, the wet-etch compositions were prepared in a manner similar to Example 1 above. The polyamic acid was applied to form a coating thickness of approximately 5 microns. The wet-etch composition bath was maintained at ambient temperature, and the etch time was approximately 30 seconds. The etch quality is reported in Table IX below.

TABLE IX

| Example Number | Polyamic Acid Composition | Wet-Etch Composition[1] | Etch Quality |
|---|---|---|---|
| 27 | OPAN/APBP/ SILOXANE | 4.4% TEA 35.0% EtOH 5.0% BuOH 0.1% PVME 55.5% Water | X[2] |
| 28 | OPAN/APBP/ SILOXANE | 0.44% TMA 35.0% EtOH 3.0% BuOH 0.1% PVME 61.46% water | E[3] |
| 29 | 6FDA/APBP | 4.4% TEA 30.0% EtOH 0.1% PVME 65.5% water | E |
| 30 | 6FDA/APBP in ethyl carbitol | 2.7% DMAE 35.0% EtOH 0.1% PVME 62.2% water | E |

1. Wt. % of the total composition.
2. X - designates a good etch
3. E - designates an excellent etch This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

We claim:

1. A wet-etch composition for selectively etching a polyamic acid of a partially cured polyamic acid comprising an aqueous solution comprising at least 50 weight percent of the total composition of water, a substituted hydrocarbon solvent, and an alkylamine wherein the weight ratio of the substituted hydrocarbon solvent to the alkylamine is about 0.1-49:49-0.1, weight the proviso that the composition contains less than 1.0 weight percent of the total composition ionic base.

2. The wet-etch composition of claim 1 wherein the hydrocarbon solvent is alcohol.

3. The composition of claim 2 wherein the alcohol comprises from 1 to 12 carbon atoms and at least one hydroxy group.

4. The composition of claim 3 wherein the alcohol is selected from the group consisting of methanol, ethanol, and butanol.

5. The composition of claim 2 wherein the alcohol is a cosolvent of ethanol and butanol.

6. The composition of claim 1 wherein the alkylamine is selected from the group consisting of triethanolamine, triethylamine, tri(hydroxymethyl)aminomethane, trimethylamine, N,N-diethylethanolamine, and N,N-dimethylethanolamine.

7. The composition of claim 1 wherein the ionic base is tetramethylammonium hydroxide.

8. The composition of claim 1 further comprising a surfactant.

9. The composition of claim 8 wherein the surfactant is polyvinylmethyl ether.

10. The composition of claim 8 wherein the surfactant is present at a concentration of from about 0.01 weight percent to about 1.0 weight percent of the total wet-etch composition.

* * * * *

UNITED STATES PATENT AND TRADEMARK OFFICE
CERTIFICATE OF CORRECTION

PATENT NO.: 5,292,445
DATED: March 8, 1994
INVENTOR(S): Douglas E. Fjare; Allyson J. Beuhler; Cynthia A Navar It is certified that error appears in the above-identified patent and that said Letters Patent is hereby corrected as shown below:

Patent reads:

| Col. | Line | |
|---|---|---|
| 16 | | Table V, Example 5, line E reads "X" should be omitted. |
| 16 | | Table V, Example 7, line E is blank should read --X--. |
| 19 | | Table VIII, Example P is omitted between Examples O and Q should read --P  TMAH  OC  None  2.5  ER  NS-- |

Signed and Sealed this

Second Day of August, 1994

Attest:

BRUCE LEHMAN

*Attesting Officer*    *Commissioner of Patents and Trademarks*